United States Patent [19]

Takemae et al.

[11] Patent Number: 4,496,850

[45] Date of Patent: Jan. 29, 1985

[54] SEMICONDUCTOR CIRCUIT FOR ENABLING A QUICK RISE OF THE POTENTIAL ON THE WORD LINE FOR DRIVING A CLOCK SIGNAL LINE

[75] Inventors: Yoshihiro Takemae, Tokyo; Shigeki Nozaki, Kawasaki; Katsuhiko Kabashima, Mizusawa; Seiji Enomoto, Yokohama, all of Japan

[73] Assignee: Fujitsu Limited, Kawasaki, Japan

[21] Appl. No.: 347,465

[22] Filed: Feb. 10, 1982

[30] Foreign Application Priority Data

Feb. 12, 1981 [JP] Japan .................................. 56-19312

[51] Int. Cl.$^3$ ...................... H03K 17/04; H03K 17/06; H03K 17/693; H03K 19/017
[52] U.S. Cl. .................................... 307/269; 307/453; 307/480; 307/481; 307/246; 365/233
[58] Field of Search ................ 307/453, 269, 481–482, 307/577–578, 582–584, 246, 444, 463; 357/23 C; 365/204, 222, 233

[56] References Cited

U.S. PATENT DOCUMENTS

| | | | |
|---|---|---|---|
| 4,240,092 | 12/1980 | Kuo | 357/23 C X |
| 4,256,976 | 3/1981 | Maggi | 307/246 X |
| 4,316,106 | 2/1982 | Young et al. | 307/481 |
| 4,376,252 | 3/1983 | Masenas, Jr. | 307/482 |
| 4,382,194 | 5/1983 | Nakano et al. | 307/264 |
| 4,413,401 | 11/1983 | Klein et al. | 357/23 C X |

Primary Examiner—Stanley D. Miller
Assistant Examiner—David R. Hudspeth
Attorney, Agent, or Firm—Staas & Halsey

[57] ABSTRACT

A semiconductor circuit for driving a clock signal line comprising a first circuit for pulling up the potential of the clock signal line to the source voltage and a second circuit for pulling down the potential of the clock signal line to a lower voltage. A capacitor is connected to the clock signal line for receiving a potential push signal and pushing the potential of the clock signal line higher than the source voltage. The capacitor performs the function of capacitance only after the potential of the clock signal line is raised to the source voltage. The operational speed of a dynamic memory device associated with the semiconductor device is then enhanced.

13 Claims, 12 Drawing Figures

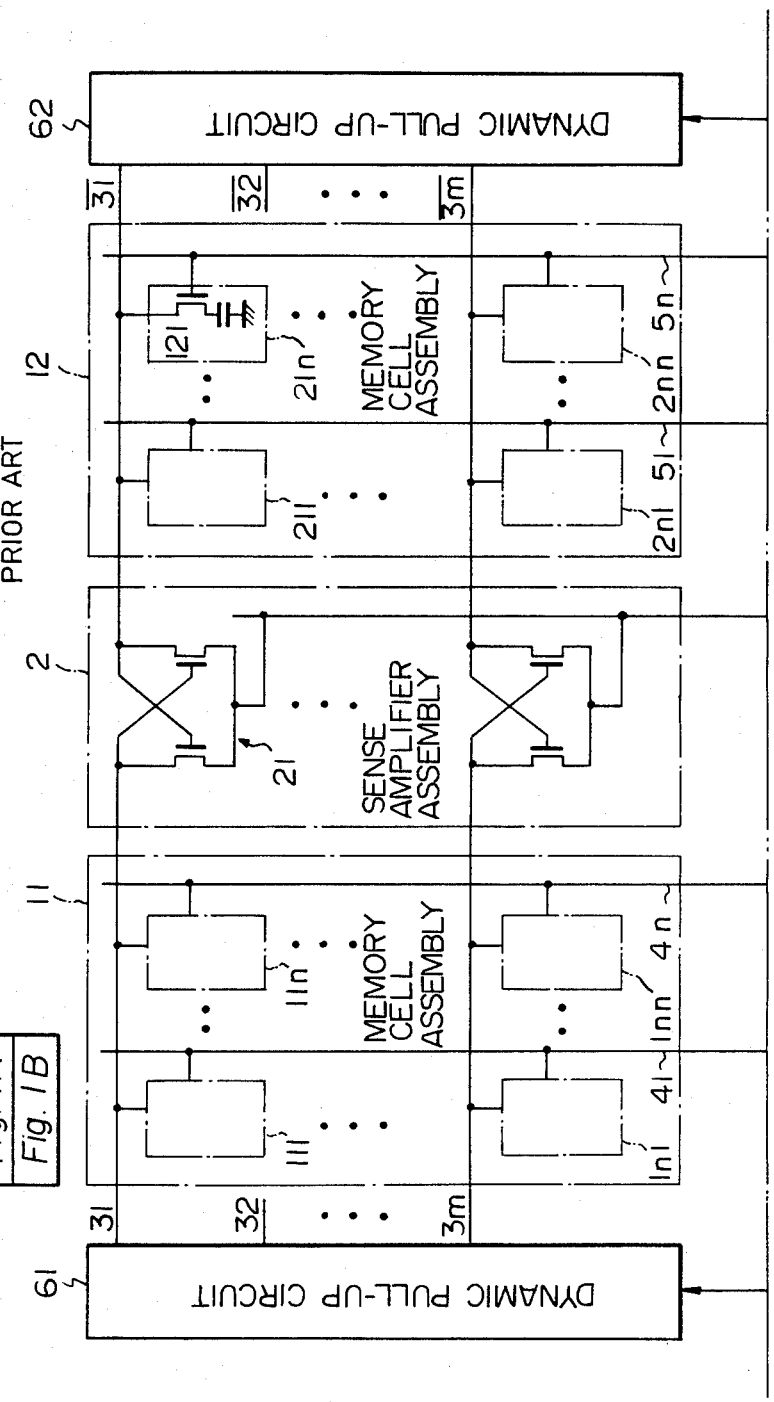

SEMICONDUCTOR CIRCUIT FOR ENABLING A QUICK RISE OF THE POTENTIAL ON THE WORD LINE FOR DRIVING A CLOCK SIGNAL LINE

BACKGROUND OF THE INVENTION

The present invention relates to a semiconductor circuit for driving a clock signal line. The semiconductor circuit according to the present invention is used, for example, for a dynamic memory device.

A circuit arrangement for a prior art dynamic memory device is illustrated in FIG. 1. The dynamic memory device of FIG. 1 comprises a sense amplifier assembly 2, memory cell assemblies 11 and 12, bit lines 31 . . . 3m and $\overline{31}$ . . . $\overline{3m}$, and dynamic pull-up circuits 61 and 62, a word decoder 63, a word decoder 64, an address buffer 71, an address buffer drive signal (AD) generator 72, a word drive signal (WD) generator 73, a latch enable signal (LE) generator 74, an active pull-up signal (AP) generator 75, a word push (WP) signal generator 8, a capacitor 91 for the bootstrap operation and a grounding transistor 92. The capacitor 91 is connected between the output terminals of the word drive signal generator 73 and the word push signal generator 8.

The operation of the dynamic memory device of FIG. 1 will be described below. An external address signal (Add) and a signal AD are supplied to the address buffer 71 which produces signals A0, A1, . . . , Ai and their inverted signals $\overline{A0}$, $\overline{A1}$, . . . , $\overline{Ai}$ which are supplied to the word decoders 63 and 64. The word decoders 63 and 64 also receive signals WD and select one of the word lines 41 through 4n and 51 through 5n. Signal LE is supplied to the transistor 92, which connects one terminal of each sense amplifier to ground, to make the corresponding sense amplifier active.

Signal AP is supplied to the dynamic pull-up circuits 61 and 62 to pull up the potential of the high side bit line to the potential $V_{cc}$. The pulled up potential of the high side bit line is re-written into the memory cell selected by the word line.

The memory cell assembly 11 includes memory cells 111 through 11n, 121 through 12n, . . . , and 1nl through 1nn. The memory cell assembly 12 includes memory cells 211 through 21n, 221 through 22n, . . . , and 2nl through 2nn. The sense amplifier assembly 2 is arranged between the memory cell assemblies 11 and 12. The memory cells, which as selected by the word lines, are connected to one side of bit line pairs 31, $\overline{31}$; 32, $\overline{32}$; . . . , 3m, $\overline{3m}$, while the dummy cells (not shown) are connected to the other side of the above mentioned bit line pairs. When the difference is formed between the potentials of the one side and the other side of the above mentioned bit line pairs, the potential of the high side bit line is pulled up by the above described pulling up operation to the potential $V_{cc}$. Such pulling up is carried out in order to cover the reduction of the potential of the high side bit line; otherwise, the potential of the high side bit line would be reduced with time due to current leakage.

Also signal WP is supplied to the WD signal line 731 through the capacitor 91 after the potential of the signal WD turns high, hence, the potential of the signal WD is pushed up to a value higher than $V_{cc}$, where $V_{cc}$ represents the high potential.

A memory cell of the dynamic memory device of FIG. 1 comprises a series connected transistor and a capacitor (one transistor one capacitor type). Each of the memory cells is connected between a bit line and power source. The gate of each transistor is connected to a word line. Signal WD defines the potential of such word line.

When the potential of the signal WD is pushed up above the $V_{cc}$ value by signal WP, the potential of the word line is raised higher than the $V_{cc}$ value; more correctly, higher than the sum of the $V_{cc}$ value and the threshold voltage of the transistor of the memory cell, hence, the transistor constituting the memory cells becomes completely in an ON state, and, accordingly, the memory cells can be sufficiently charged, i.e. refreshed, by the power source of the $V_{cc}$ up to the potential $V_{cc}$.

The word decoders 63 And 64, comprising a nor gate 642 and a transistor 641, receive address signals A0, A1, . . . , Ai and $\overline{A0}$, $\overline{A1}$, . . . , $\overline{Ai}$ and carry out the selection of a word line. Either the source or the drain region of the transistor 641 is connected to the WD signal generator 73, while the other is connected to a word line.

The change of the potential of the signals appearing at various portions of the device of FIG. 1 will be explained with reference to the waveforms illustrated in FIGS. 3 and 4. When the transistor 641 in the word decoder 64 turns on and the potential of the output signal of the word drive signal generator 73 becomes high, the potential W of the word line is raised as illustrated in FIG. 3. Memory cells are connected to bit lines, and potentials of the bit lines charged to the $V_{cc}$ value, for example, bit lines 31 and $\overline{31}$, are caused to become different. When such a difference in the potential is formed, the potential of the signal LE is raised, and, the transistor 92 turns ON to activate the sense amplifier 21, accordingly, the difference in the potentials of the bit lines 3m and $\overline{3m}$ is enlarged. When a sufficient difference between the potentials B and $\overline{B}$ of the bit lines is formed, the potential of the signal AP is raised, and the potential of the high side bit line is pulled up to the $V_{cc}$ value. Then, after the potential of the WD signal line 731 becomes in a floating state, the signal WP is raised, the potential of the word line is pushed up above the $V_{cc}$ value, and the transistor 121 of the memory cell is made to be completely in an ON state as illustrated in FIG. 4.

The structure of the output side portion of the word drive signal generator 73 is as illustrated in FIG. 1. When the transistor 732 is turned ON and the transistor 733 is turned OFF by the signals S1 and S2, the potential of the WD signal line 731 is raised to the $V_{cc}$ value, as illustrated in FIG. 4. While the potential of the signal WP is low, the capacitor 91 is connected between the WD signal line 731 and ground and acts as a load for the output transistors 732 and 733.

However, in order to satisfactorily push up the potential of the word line, the capacitor 91 is required to have a large capacitance, which is the same as or larger than the stray capacitance, the value of which is, for example, 10 to 20 pF for the WD signal line 731 and word lines, which makes the capacitor load a large one. If such a large capacitor load is used, the rising speed of the potential of the signal WD becomes inevitably slow, the access time of the memory device is increased, and the operational characteristic of the memory device deteriorates.

SUMMARY OF THE INVENTION

The present invention has been proposed in order to solve the problems in the prior device described. The basic feature of the present invention is the use of a capacitor having a large capacitance to enable a sufficient rise of the potential of the word line and also to enable the quick rising of the potential of the word line.

The main object of the present invention is to realize an operation of a semiconductor circuit for making the output voltage higher than the source voltage. A capacitor used for raising the potential is invalidated at the beginning of the operation, and, when the output voltage is raised up to the source voltage, the capacitor is made valid and is charged, whereby the voltage for raising the potential is applied to the capacitor to cause the bootstrap effect. The quick rise of the output signal due to a light load is achieved and the access time of the dynamic memory device is reduced.

According to one aspect of the present invention, a semiconductor circuit is provided, which produces an output voltage higher than the source voltage for driving a clock signal line, comprising a first circuit for pulling up the potential of the clock signal line to the source voltage, a second circuit for pulling down the potential of the clock signal line to a lower voltage, and a capacitor connected to the clock signal line for receiving a potential push signal to push up the potential of the clock signal line so that it is higher than the source voltage. When the second circuit is in an OFF state and the potential of the clock signal line is pulled up to the source voltage by the first circuit, the capacitor is not able to perform the function of capacitance. After the potential of the clock signal line is raised to the source voltage, the capacitor is able to perform the function of capacitance and by the receipt of the potential push signal, exerts a bootstrap effect.

According to another aspect of the present invention a semiconductor circuit is provided which produces an output voltage higher than the source voltage for driving a clock signal line, comprising a first circuit for pulling up the potential of the clock signal line to the source voltage, a second circuit for pulling down the potential of the clock signal line to a lower voltage, and a capacitor connected to the clock signal line for receiving a potential push signal to push the potential of the clock signal line up to a potential higher than said source voltage, wherein said capacitor comprises an MIS capacitor, and a signal generating circuit produces the potential push signal, the potential changing from the $V_{cc}$ value of the first terminal of the source to the $V_{ss}$ value of the second terminal of the source, and then from the $V_{ss}$ value of the second terminal of the source to the $V_{cc}$ value of the first terminal of the source. The signal generating circuit is connected to one of the electrodes of the MIS capacitor to control the formation of the inversion layer, whereby the state of the MIS capacitor is changed from the state of not being able to perform the function of capacitance to the state of being able to perform the function of capacitance, thereby exerting the bootstrap effect.

According to another aspect of the present invention a semiconductor circuit is provided, which produces an output voltage higher than the source voltage for driving a clock signal line, comprising a first circuit for pulling up the potential of the clock signal line to the source voltage, a second circuit for pulling down the potential of the clock signal line to a lower voltage, and a capacitor connected to the clock signal line for receiving a potential push signal to push up the potential of the clock signal line to a value higher than the source voltage, and a signal generating circuit for producing the potential push signal. The potential of the signal generating circuit changes from a floating state to the $V_{cc}$ value of the first terminal of the source. The signal generating circuit is connected to one of the electrodes of the capacitor, whereby the state of the capacitor is changed from the state of not being able to perform the function of capacitance to the state of being able to perform the function of capacitance and then exert the bootstrap effect.

BRIEF DESCRIPTION OF THE DRAWINGS

FIGS. 1A and 1B are circuit arrangements of a prior art dynamic memory device;

DESCRIPTION OF THE PREFERRED EMBODIMENTS

Figure 1B:
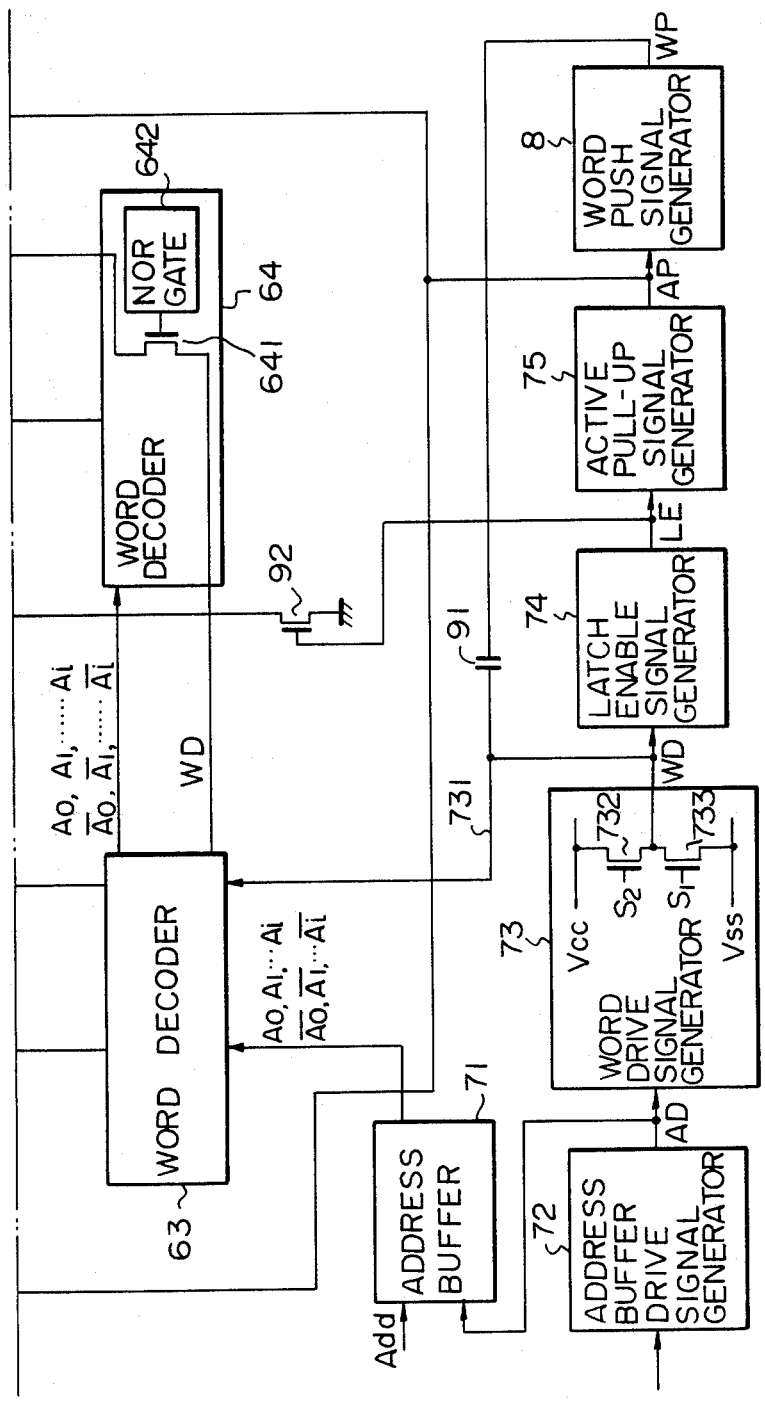

An embodiment of the present invention will be explained below. The signal WP applied to an MOS capacitor in the embodiment of the present invention is different from the signal WP applied to the capacitor 91 in the dynamic memory device of FIG. 1.

Figure 2:
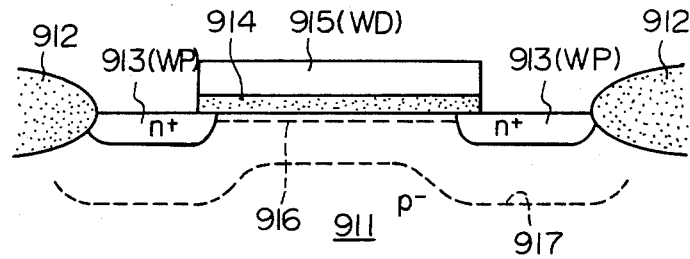
FIG. 2 is a cross-sectional view of the capacitor for the bootstrap operation used in the device of FIG. 1.

The structure of the capacitor 91 is illustrated in FIG. 2. In general, an MIS (metal insulator semiconductor) capacitor is used for the capacitor 91. In FIG. 2, an MOS (metal oxide semiconductor) capacitor 91 which represents the MIS capacitor is illustrated. The MOS capacitor 91' of FIG. 2 comprises a p-type semiconductor substrate, a thick field oxide layer 912 covering the periphery of the active region of the device, and an n+ type diffusion region 913 which corresponds to source and drain regions of an MOS transistor. Although in the MOS transistor, the diffusion regions in the left and the right sides are separated, in the MOS capacitor of FIG. 2, the diffusion regions are connected to form a ring. The MOS capacitor of FIG. 2 also comprises a thin oxide film 914, and an electrode 915 made of polycrystalline silicon. When a voltage is applied between the electrode 915 and the diffusion region 913 giving a positive polarity to the electrode 915, an inversion layer (channel) 916 is produced, and a capacitor, having the inversion layer 916 and the diffusion regon 913 as a first electrode and the electrode 915 as a second electrode, is formed. Since such first and second electrodes are opposite each other, having only a thin oxide film 914 between them, the thus formed capacitor has a large capacitance. The lower limit of the depletion layer is indicated by a broken line 917. When a voltage is applied between the electrode 915 and the diffusion region 913, giving a negative polarity to the electrode 915, no inversion layer is produced, and, hence, almost no capacitance is formed.

In the preferred embodiment of the present invention, utilizing the characteristic of the MOS capacitor 91, described with reference to FIG. 2, the following control operation is carried out. The electrode 915 of the capacitor is connected to the WD signal line 731. The diffusion region 913 of the capacitor is connected to the output terminal of the word push signal generator 8, the output signal WP of which is at the potential $V_{cc}$ at the beginning, then falls to the potential $V_{ss}$, and is finally raised again to the potential $V_{cc}$.

Figure 7:
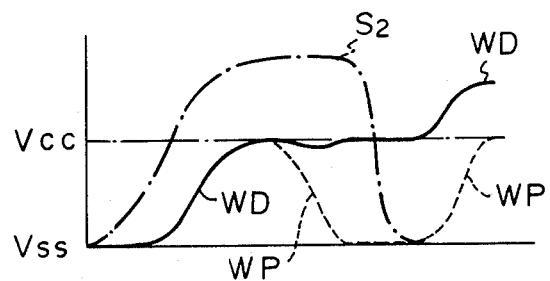
FIG. 7 illustrates the waveforms of the signal WP and the related signals in connection with the circuit of FIG. 5.

The above described change of the signal WP and the changes of the related signals are illustrated in FIG. 7. $V_{ss}$ is the potential of the second terminal of the power source. As illustrated in FIG. 7, the signal WP is maintained at the potential $V_{cc}$ until the potential of the WD signal line 731 reaches $V_{cc}$ from $V_{ss}$. After the potential of the WD signal 731 reaches $V_{cc}$, The potential of the WP signal is reduced to $V_{ss}$, then the potential of the signal S2 is reduced to $V_{ss}$ to turn the transistor 731 to an OFF state, and the potential of the signal WP is raised back to $V_{cc}$.

During the first period, in which the potential of the signal WP is $V_{cc}$, the potential of the electrode 915 is negative or zero with respect to the diffusion region 913, and the MOS capacitor hardly has any capacitance. Thus, the transistor 732 of the word drive signal generator 73 has only a light load of the WD signal line 731, and can raise the potential of the WD signal line 731 quickly to $V_{cc}$.

When the potential of the signal WP is made $V_{ss}$ under the condition that the potential of the WD signal line 731 is $V_{cc}$, it is regarded that a positive voltage, with respect to the diffusion region 913, is applied to the electrode 915, and the MOS capacitor 91 becomes a predetermined capacitance value. The capacitor having such capacitance value is immediately charged by the potential $V_{cc}$ of the WD signal line 731, and under the influence of such charging current the potential of the WD signal line 731 tends to be temporarily reduced, but is maintained at the potential $V_{cc}$, because the WD signal line is immediately charged through the transistor 732.

After the potential of the signal WP becomes $V_{ss}$ and the potential of the WD signal line 731 becomes $V_{cc}$ by the charging through the transistor 732, the potential of the signal S2 is made $V_{ss}$, and the transistor 732 is turned off. After that, when the potential of the signal WP is raised to $V_{cc}$, the bootstrap effect, due to the capacitor 91 charged to $V_{cc}$, is exerted, and the potential of the WD signal line 731 is pushed up above $V_{cc}$.

In a dynamic memory device, in order to quickly connect memory cells to the bit line, the rate of the rise of the potential of a word line to $V_{cc}$ is important, while no trouble is incurred by a little delay of the following rise of the potential up above $V_{cc}$. Thus, the above described temporary reduction of the potential of the WD signal line 731, when the potential of the signal WP is made $V_{ss}$, does not prevent the realization of a high speed operation of the device.

Figure 5:
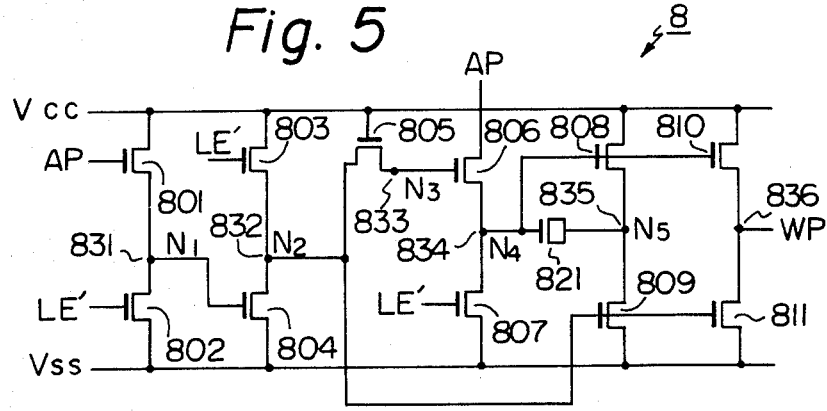
FIG. 5 is a circuit diagram of an example of the word push signal generator used in an embodiment of the present invention.
Figure 6:
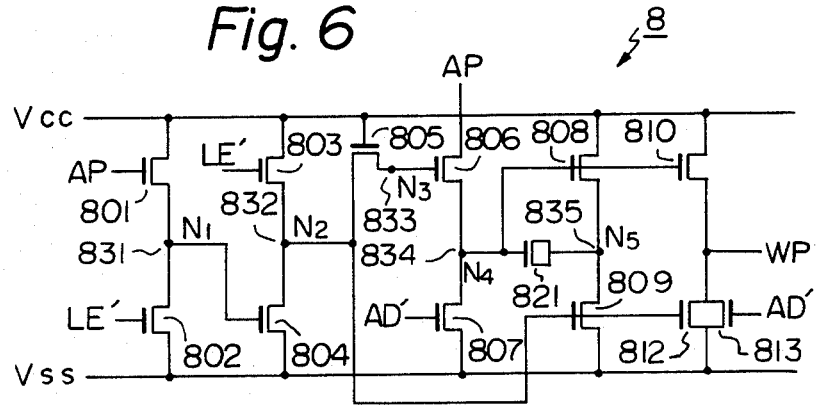
FIG. 6 is a circuit diagram of another example of the word push signal generator used in an embodiment of the present invention.

Examples of the word push signal generator 8 used in the semiconductor circuit according to an embodiment of the present invention are illustrated in FIGS. 5 and 6. The word push signal generator 8 of FIG. 5 or FIG. 6 is applied to the semiconductor circuit of FIG. 1.

Figure 9:
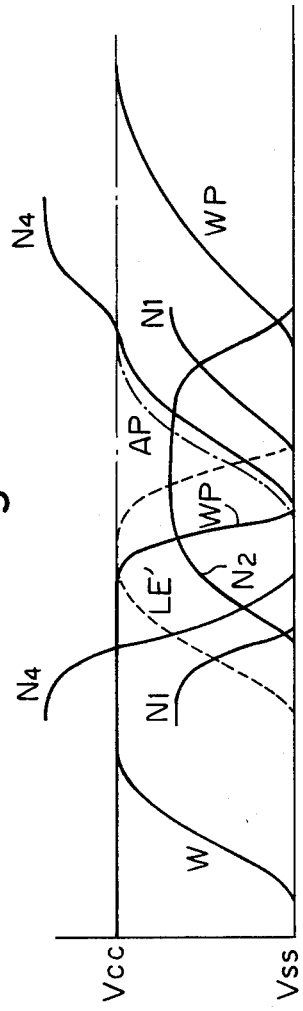

The word push signal generator 8 of FIG. 5 comprises MOS transistors 801, 802, 803, 804, 805, 806, 807, 808, 809, 810 and 811, and a capacitor 821. At the beginning, the latch enable signal LE', which corresponds to the latch enable signal LE, is at the potential $V_{ss}$, the transistors 802, 803 and 807 are in an OFF state, hence, the nodes 831 and 834 are at a high potential, the transistors 804, 808 and 810 are in an ON state, hence, the node 832 is at the potential $V_{ss}$, the transistors 809 and 811 are in an OFF state and, accordingly, the WP signal is at the potential $V_{cc}$ (FIG. 9).

When the potential of the LE' signal is raised, the transistors 802, 803 and 807 turn on, hence, the potentials of the nodes 831 and 834 fall, the transistors 804, 808 and 810 turn off, hence, the potential of the node 832 is raised, the transistors 809 and 811 turn on, and, accordingly, the potential of the WP signal falls.

Then, when the potential of the LE' signal falls and the potential of the AP signal is raised, the potential of the node 834 is raised with the rise of the potential of the AP signal and the potential of the node 831 is raised, the transistor 804 turns on, hence, the potential of the node 832 falls, the transistors 809 and 811 turn off, and, accordingly, the potential of the WP signal is raised up to the $V_{cc}$ value. Then, the potential of the node 835 is raised with the rise of the WP signal, and the potential of the node 834 is pushed up above the potential $V_{cc}$ by the bootstrap effect through the capacitor 821. As a result, the transistor 810 turns completely on, and the potential of the WP signal reaches up to the $V_{cc}$ value. The potentials of the nodes 831 and 834 are at high levels at the beginning (FIG. 9, left portion), because the potentials of the nodes 831 and 834 are maintained until the next cycle (FIG. 9, right portion).

Figure 8:
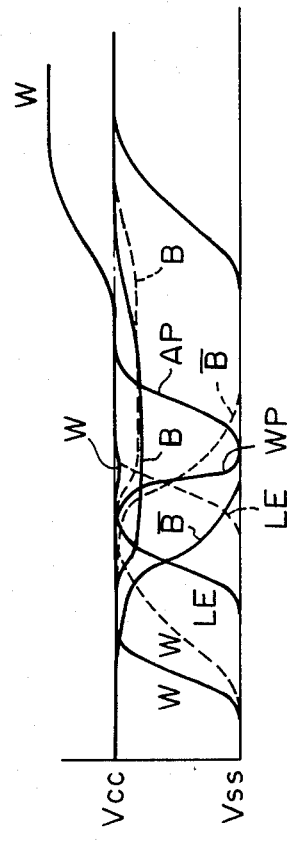
FIGS. 8 and 9 illustrate the waveforms of the signals appearing in the portions of the word push signal generator of FIG. 5.

In FIG. 8, the changes with time of the potential of the work line signal W, the bit line signal B, the signal LE, the signal AP and the signal WP are illustrated.

In FIG. 9, the changes with time of the potential $N_1$ of the node 831, the potential $N_2$ of the node 832, and the potential $N_4$ of the node 834 are illustrated.

Another example of the word push signal generator is illustrated in FIG. 6. The word push signal generator 8 of FIG. 6 is similar to that of FIG. 5. However, the word push signal generator 8 of FIG. 6 is different from that of FIG. 5 in that a pair of parallel connected transistors 812 and 813 are connected in place of the transistors 811 of FIG. 5, and in that the AD' signal corresponding to the AD signal, not the LE' signal, is applied to the gate of the transistor 807.

In the word push signal generator of FIG. 6, both the transistor 810 and the transistor pair 812, 813 can be made in an OFF state and, the potential of the WP signal can be made in a floating state, in which the WP signal potential does not become the $V_{cc}$ value or the $V_{ss}$ value, as in the case of the word push signal generator of FIG. 5. The changes of the potentials of the portions of the word push signal generator of FIG. 6 are illustrated in FIGS. 10 and 11.

During the period between t1 and t2, the potentials of the nodes 832 and 834 are the $V_{ss}$ value, hence, the transistors 808, 809, 810 and 812 are in an OFF state, and also the transistor 813, which receives the AD' signal, is in an OFF state. Thus, the potential of the WP signal is in a floating state. At this moment, a WD signal is produced and the potential of the word line is raised, hence, the potential of the WP signal is raised through the capacitance coupling. However, the capacitor 91 does not function as a load capacitance of the word line, because one of the electrode connections of the capacitor is in a floating state, and the potential of the WP signal is raised with the rise of the potential of the word line. Accordingly, instead of the MOS capacitor, an ordinary capacitor can be used as the capacitor 91, as in the case of the word push signal generator of FIG. 6.

Figure 3:
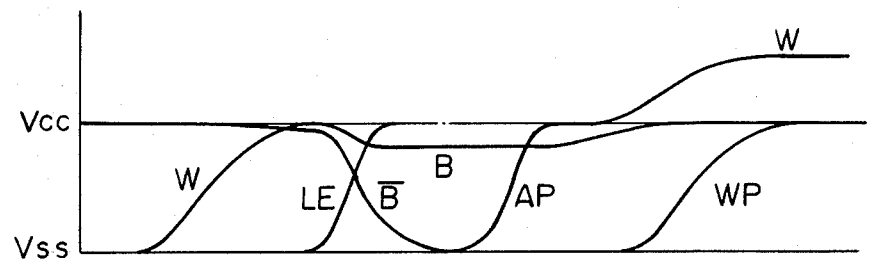
FIGS. 3 and 4 are the waveforms of the signals appearing in the portions of the device of FIG. 1.
Figure 4:
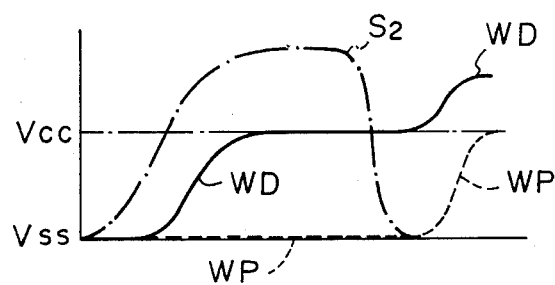
Figure 10:
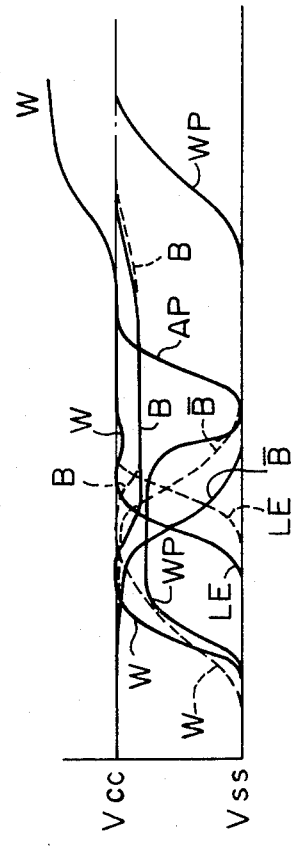
FIGS. 10 and 11 illustrate the waveforms of the signals appearing in the portions of the word push signal generator of FIG. 6.
Figure 11:
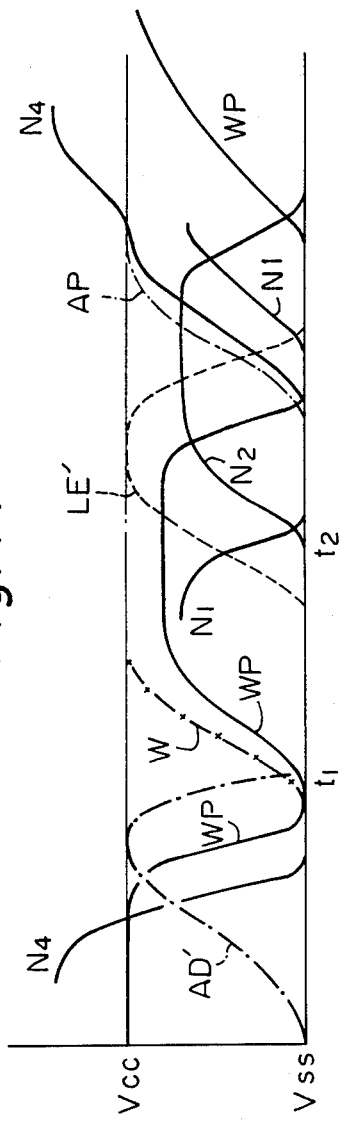

The signals W, LE, B and B̄ in FIG. 3 are indicated in FIGS. 8 and 10 by broken lines.

Although in the above description the preferred embodiments of the present invention are described, it should be understood that various modified embodiments are possible within the scope of the present invention. For example, although in the preferred embodiments described, the semiconductor circuit of the present invention is used for a dynamic memory device, the present invention is applicable in general to circuits for driving a clock signal line in which the output voltage is made higher than the source voltage.

We claim:

1. A semiconductor circuit for receiving a source voltage between first and second terminals, operatively connected to receive a potential push signal having first and second reference levels, for producing an output voltage higher than a source voltage at the first terminal of the source for driving a clock signal line, comprising:
    a first circuit, operatively connected to the clock signal line and the first terminal of the source, for pulling up the potential of the clock signal line to the source voltage;
    a second circuit, operatively connected to the clock signal line and the second terminal of the source, for pulling down the potential of said clock signal line to a voltage lower than the source voltage;
    a capacitor having a first electrode operatively connected to the clock signal line and having a second electrode operatively connected to receive the potential push signal, said capacitor pushing the potential of the clock signal line up to a potential higher than the source voltage, said capacitor comprising an MIS capacitor; and
    a signal generating circuit, operatively connected to the second electrode of said capacitor, for producing the potential push signal, the potential of which changes from the first reference level of the potential push signal to the second reference level of the potential push signal, and then from the second reference level of the potential push signal to the first reference level of the potential push signal, said signal generating circuit functioning during the time the potential of the clock signal line is pulled up to the source voltage by said first circuit, the potential of the push signal being at the first reference level so that said MIS capacitor remains uncharged, and after the potential of the clock signal line is pulled up, the potential of the potential push signal changes from the first reference level to the second reference level and then back to the first reference level, charging the MIS capacitor and exerting a bootstrap effect so that the potential of the clock signal line becomes higher than the source voltage.

2. A semiconductor circuit for receiving a source voltage between first and second terminals, operatively connected to receive a potential push signal having first and second reference levels, for producing an output voltage higher than a source voltage at the first terminal of the source for driving a clock signal line, comprising:
    a first circuit, operatively connected to the clock signal line and the first terminal of the source, for pulling up the potential of the clock signal line to the source voltage;
    a second circuit, operatively connected to the clock signal line and the second terminal of the source, for pulling down the potential of the clock signal line to a voltage lower than the source voltage;
    a capacitor having a first electrode operatively connected to the clock signal line, and having a second electrode operatively connected to receive the potential push signal, for pushing up the potential of the clock signal line to a value higher than the source voltage; and
    a signal generating circuit, operatively connected to one of said electrodes of said capacitor, for producing the potential push signal, the potential of which, when the potential of the clock signal line rises to the source voltage, rises following thereto, and, after the potential of the clock signal has risen, the potential of the push signal falls to the second reference level and then rises to the first reference level, raising the potential of the clock signal line to a level higher than the source voltage due to the bootstrap effect of the capacitor.

3. A semiconductor circuit as claimed in claim 1 or 2, wherein the clock signal line is a word line of a dynamic memory device, and wherein said signal generating circuit is a word push signal generator.

4. A semiconductor circuit as claimed in claim 1 or 2, wherein said first and second circuits comprise a first transistor and a second transistor, respectively, operatively connected to the clock signal line.

5. A semiconductor circuit for receiving a source voltage between first and second terminals, for producing an output voltage higher than a source voltage for driving a clock signal line, comprising:
    first means, operatively connected to the clock signal line and the first terminal of the source, for pulling up the potential of the clock signal line to the source voltage;
    second means, operatively connected to the clock signal line and the second terminal of the source, for pulling down the potential of the clock signal line to a voltage lower than the source voltage;
    third means, operatively connected to the clock signal line, for generating a potential push signal having first and second reference levels, the first reference level being higher than the second reference level; and
    fourth means, operatively connected to the clock signal line, for receiving said potential push signal and for storing charges after the potential of the clock signal line is raised to the source voltage and the potential push signal changes from the first reference level to the second reference level and then back to the first reference level, so that a bootstrap effect is exerted and the clock signal line is raised to a level higher than the source voltage.

6. A semiconductor circuit as claimed in claim 5, wherein said means for receiving said potential push signal comprises:
    a MIS (metal insulator semiconductor) capacitor having first and second electrodes, said first electrode connected to said means for generating the potential push signal said second electrode connected to said clock signal line, said potential push signal controlling the charging of said MIS capacitor by means of changing from the first reference level to the second reference level and back to the first reference level, so that the capacitive function of said MIS capacitor is impeded, then enabled and said MIS capacitor then exerts the bootstrap effect.

7. A semiconductor circuit as claimed in claim 5, wherein said means for receiving the potential push signal comprises a capacitor, wherein when the potential push signal changes from a floating state to the first reference level, then to the second reference level and back to the first reference level, the state of said capacitor changes from an uncharged state to a charged state, thus exerting the bootstrap effect.

8. A semiconductor circuit as claimed in claim 5, wherein the clock signal line comprises a word line of a dynamic memory device, and wherein said means for generating the potential push signal comprises a word push signal generator.

9. A semiconductor as claimed in claim 5, wherein said first circuit comprises a first transistor and wherein said second circuit comprises a second transistor.

10. A semiconductor circuit as claimed in claim 6, wherein the clock signal line comprises a word line of a dynamic memory device, and wherein said means for generating the potential push signal comprises a word push signal generator.

11. A semiconductor circuit as claimed in claim 7, wherein the clock signal line comprises a word line of a dynamic memory device, and wherein said means for generating the potential push signal comprises a word push signal generator.

12. A semiconductor as claimed in claim 6, wherein said first circuit comprises a first transistor and wherein said second circuit comprises a second transistor.

13. A semiconductor as claimed in claim 7, wherein said first circuit comprises a first transistor and wherein said second circuit comprises a second transistor.

* * * * *

UNITED STATES PATENT AND TRADEMARK OFFICE
CERTIFICATE OF CORRECTION

PATENT NO. :   4,496,850
DATED      :   JANUARY 29, 1985
INVENTOR(S) :  YOSHIHIRO TAKEMAE ET AL.

It is certified that error appears in the above-identified patent and that said Letters Patent is hereby corrected as shown below:

```
Col. 1, line 48, "as" should be --are--.

Col. 3, line 32, "and by the" should be --and, by--;
        line 44, "said" should be --the--.

Col. 4, line 17, delete "the" (first occurrence);
        line 46, "91'" should be --91--.

Col. 5, line 19, "The" should be --the--.

Col. 6, line 34, "work" should be --word--.

Col. 8, line 64, "signal" should be --signal,--.
```

Signed and Sealed this

Tenth Day of September 1985

[SEAL]

Attest:

DONALD J. QUIGG

Attesting Officer    Acting Commissioner of Patents and Trademarks - Designate